United States Patent
Takahashi

(10) Patent No.: US 8,441,003 B2
(45) Date of Patent: May 14, 2013

(54) PHOSPHORESCENT POLYMER COMPOUND BASED ON IRIDIUM POLYMER COMPLEX AND ORGANIC ELECTROLUMINESCENT DEVICE UTILIZING THE SAME

(75) Inventor: Yoshiaki Takahashi, Chiba (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 12/599,939

(22) PCT Filed: Jun. 24, 2008

(86) PCT No.: PCT/JP2008/061800
§ 371 (c)(1),
(2), (4) Date: Nov. 12, 2009

(87) PCT Pub. No.: WO2009/001953
PCT Pub. Date: Dec. 31, 2008

(65) Prior Publication Data
US 2010/0213445 A1    Aug. 26, 2010

(30) Foreign Application Priority Data
Jun. 28, 2007  (JP) .................................. 2007-170646

(51) Int. Cl.
*H01L 51/30*    (2006.01)
*H05B 33/14*    (2006.01)

(52) U.S. Cl.
USPC ............ 257/40; 252/503; 428/690; 428/917; 430/71; 430/78

(58) Field of Classification Search ................. 252/502, 252/503; 257/40; 428/690, 917; 430/71, 78
See application file for complete search history.

(56) References Cited

U.S. PATENT DOCUMENTS 6,545,159 B2   4/2003   Lee et al.
6,660,821 B2   12/2003  Lee et al.

(Continued)

FOREIGN PATENT DOCUMENTS

CN   1791655 A    6/2006
JP   8-157575 A   6/1996

(Continued)

OTHER PUBLICATIONS

Lo, Shih-Chun, et al, "Blue Phosphorescence From Iridium (III) Complexes at Room Temperature," Chemistry of Materials, vol. 18, Oct. 17, 2006, pp. 5119-5129.

(Continued)

*Primary Examiner* — Anh Mai
(74) *Attorney, Agent, or Firm* — Sughrue Mion, PLLC

(57) ABSTRACT

A phosphorescent polymer compound including structural units that are derived from a compound represented by Formula (1):

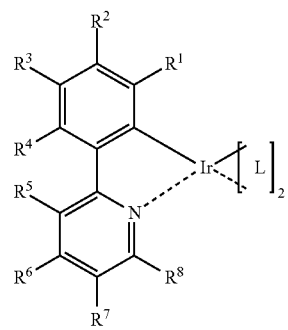

(1)

wherein $R^1$ to $R^8$ and L are as defined herein.

5 Claims, 1 Drawing Sheet

U.S. PATENT DOCUMENTS

| | | |
|---|---|---|
| 6,869,693 B2 | 3/2005 | Fryd et al. |
| 7,060,372 B2 | 6/2006 | Fryd et al. |
| 7,311,982 B2 | 12/2007 | Christou et al. |
| 2004/0247934 A1* | 12/2004 | Takeuchi et al. ............ 428/690 |
| 2005/0003233 A1 | 1/2005 | Igarashi et al. |
| 2006/0008670 A1 | 1/2006 | Lin et al. |
| 2006/0251923 A1 | 11/2006 | Lin et al. |
| 2007/0069638 A1 | 3/2007 | Matsuura et al. |
| 2008/0050604 A1 | 2/2008 | Takahashi et al. |
| 2008/0179798 A1 | 7/2008 | Saiki et al. |

FOREIGN PATENT DOCUMENTS

| | | |
|---|---|---|
| JP | 10-1665 A | 1/1998 |
| JP | 2002-293830 A | 10/2002 |
| JP | 2004-526024 A | 8/2004 |
| JP | 2004-513850 A | 10/2004 |
| JP | 2004-531850 A | 10/2004 |
| JP | 2006-8996 A | 1/2006 |
| TW | 200613514 | 5/2006 |
| TW | 200715909 | 4/2007 |
| WO | 03/102109 A1 | 12/2003 |
| WO | 2004/101707 A1 | 11/2004 |

OTHER PUBLICATIONS

Frutos, Rogelio P., et al., "Expedient Synthesis of Substitute Imidazoles From Nitriles,", Tetrahedron Letters, 46 (2005) pp. 8369-8372.

* cited by examiner

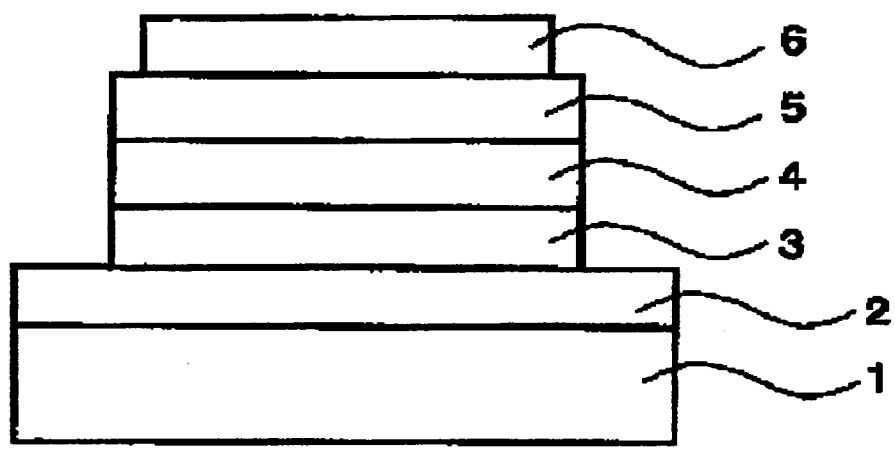

PHOSPHORESCENT POLYMER COMPOUND BASED ON IRIDIUM POLYMER COMPLEX AND ORGANIC ELECTROLUMINESCENT DEVICE UTILIZING THE SAME

FIELD OF THE INVENTION

The present invention relates to phosphorescent polymer compounds. In more detail, the invention relates to phosphorescent polymer compounds that are suited for use as light-emitting materials for organic electroluminescent devices, and to organic electroluminescent devices manufactured with the compounds.

BACKGROUND ART

To expand the applications of organic electroluminescent devices (hereinafter also referred to as organic EL devices), active research has been conducted seeking development of materials with phosphorescent compounds having high luminance efficiency. In particular, for organic EL devices to be used in displays, materials are required to show high luminance efficiency and ensure stable and long performance of the devices.

Patent Document 1 discloses a luminescent polymer material that has a phosphorescent iridium complex as a side chain of the polymer. The iridium complex has two phenylpyridine ligands and one β-diketonate ligand coordinated to an iridium atom, and the β-diketonate ligand is bonded to the polymer main chain. The luminescence from the iridium complex is probably attributed to electron transition between the metal and the phenylpyridine ligands or within the phenylpyridine ligands.

Patent Document 2 discloses a phosphorescent iridium complex (and a polymer thereof) that has two phenylpyridine ligands and one β-diketonate ligand with a polymerizable functional group. This polymerizable iridium complex affords polymers similar to those described in Patent Document 1.

Patent Documents 3 and 4 disclose luminescent polymer materials wherein a tris(phenylpyridine)iridium complex structure that is a side chain provides phosphorescence emission. The light emission is probably attributed to electron transition between the metal and the phenylpyridine ligands or within the phenylpyridine ligands. It is possible that all the three phenylpyridine ligands may be involved in the light emitting.

However, organic EL devices manufactured using the luminescent materials of Patent Documents 1 to 4 are still unsatisfactory in luminance efficiency and durability.

Patent Document 1: JP-A-2004-531850
Patent Document 2: JP-A-2004-526024
Patent Document 3: JP-A-2002-293830
Patent Document 4: JP-A-2006-8996

SUMMARY OF THE INVENTION

It is therefore an object of the present invention to provide organic EL devices having high luminance efficiency and long life.

The present inventors studied diligently to solve the aforementioned problems, and have determined causes that decrease the luminance efficiency and life of organic EL devices with luminescent polymer materials. First, in the conventional luminescent polymer materials, the iridium complex structure that is a light-emitting site has too many emitting ligands. Second, the light-emitting sites have so high degree of freedom that they will form an excimer together or with a charge carrier. Third, the emitting ligands are physically close to quenchers generated during the operation of the device. The present inventors have then found that the luminance efficiency and life of organic EL devices are improved by limiting the emitting ligand in an iridium complex structure to only one ligand bonded to the main chain of a polymer compound. The present invention has been completed based on the findings.

The present invention relates to the following [1] to [5].

[1] A phosphorescent polymer compound comprising structural units that are derived from a compound represented by Formula (1):

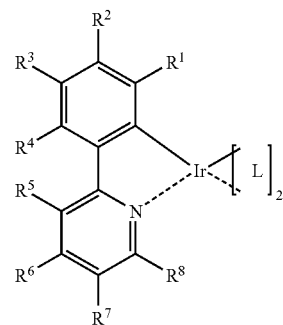

(1)

wherein $R^1$ to $R^8$ are each independently a hydrogen atom, a halogen atom, a cyano group, a C1-10 alkyl group, a C6-10 aryl group, a C1-15 heteroaryl group, an amino group optionally substituted with a C1-10 alkyl group, a C1-10 alkoxy group, a silyl group optionally substituted with a C1-10 alkyl group, or a group having a radically polymerizable functional group, and one of $R^1$ to $R^8$ is a group having a radically polymerizable functional group;

L is a ligand represented by any of Formulae (1a) to (1i) below, and the two ligands L may be the same or different from each other; and the five-membered ring in the ligand L may have a substituent group selected from the group consisting of C1-10 alkyl groups, amino groups optionally substituted with a C1-10 alkyl group, and C1-10 alkoxy groups;

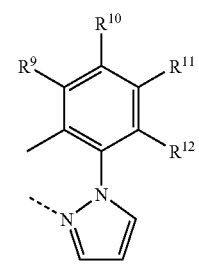

(1 a)

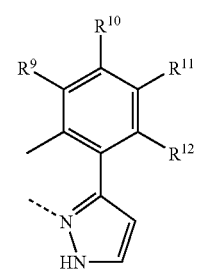

(1 b)

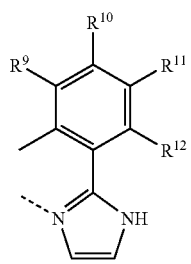 (1 c)

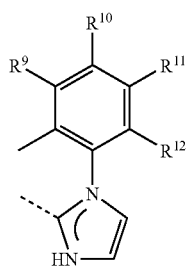 (1 d)

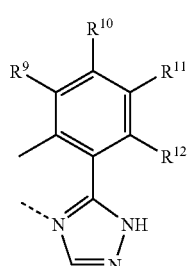 (1 e)

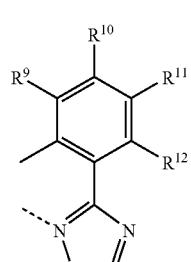 (1 f)

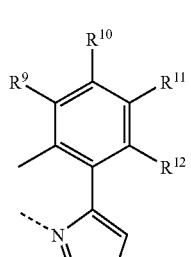 (1 g)

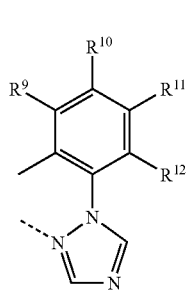 (1 h)

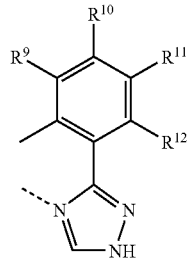 (1 i)

wherein $R^9$ to $R^{12}$ are each independently a hydrogen atom, a halogen atom, a cyano group, a C1-10 alkyl group, an amino group optionally substituted with a C1-10 alkyl group, a C1-10 alkoxy group, or a silyl group optionally substituted with a C1-10 alkyl group.

[2] The phosphorescent polymer compound described in [1], which further comprises structural units derived from at least one of hole-transporting polymerizable compounds and electron-transporting polymerizable compounds.

[3] An organic electroluminescent device comprising a pair of electrodes, and one or more organic compound layers including at least an emitting layer between the electrodes, the emitting layer comprising the polymer compound described in [1] or [2].

[4] A process for producing organic electroluminescent devices, comprising a step of forming one or more organic compound layers on an anode, the one or more organic compound layers including at least a layer comprising the polymer compound described in [1] or [2], and a step of forming a cathode on the organic compound layer.

[5] A display apparatus including the organic electroluminescent device described in [3].

Organic EL devices manufactured with the phosphorescent polymer compound according to the present invention have superior luminance efficiency and life.

BRIEF DESCRIPTION OF THE DRAWING

FIG. 1 is a sectional view showing an organic EL device according to an embodiment of the present invention.

DESCRIPTION OF NUMERALS

1: transparent substrate
2: anode
3: hole-transporting layer
4: emitting layer
5: electron-transporting layer
6: cathode

DESCRIPTION OF THE PREFERRED EMBODIMENTS

The present invention will be described in detail.
(Phosphorescent Polymer Compounds)
Phosphorescent Sites The phosphorescent polymer compound of the invention includes structural units derived from a phosphorescent compound (iridium complex) represented by Formula (1) below. The structural units are phosphorescent sites in the phosphorescent polymer compound.

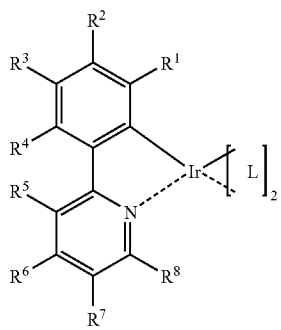

(1)

In Formula (1), $R^1$ to $R^8$ are each independently a hydrogen atom, a halogen atom, a cyano group, a C1-10 alkyl group, a C6-10 aryl group, a C1-15 heteroaryl group, an amino group optionally substituted with a C1-10 alkyl group, a C1-10 alkoxy group, a silyl group optionally substituted with a C1-10 alkyl group, or a group having a radically polymerizable functional group, and one of $R^1$ to $R^8$ is a group having a radically polymerizable functional group;

L is a ligand represented by any of Formulae (1a) to (1i) below, and the two ligands L may be the same or different from each other; and the five-membered ring in the ligand L may have a substituent group selected from the group consisting of C1-10 alkyl groups, amino groups optionally substituted with a C1-10 alkyl group, and C1-10 alkoxy groups;

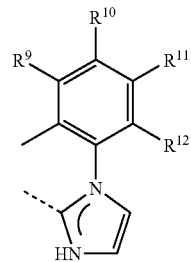

(1a)

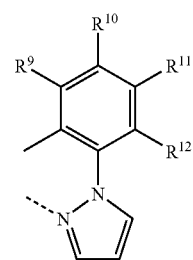

(1b)

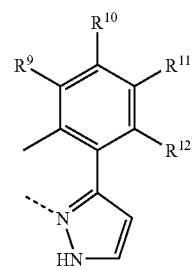

(1c)

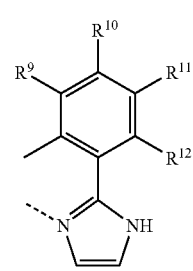

-continued

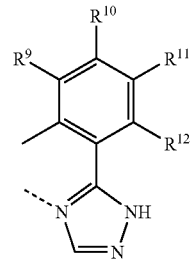

(1d)

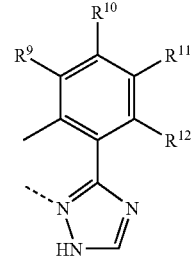

(1e)

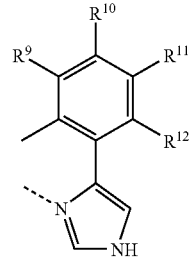

(1f)

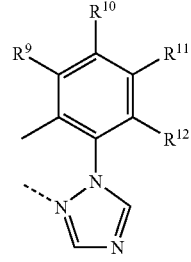

(1g)

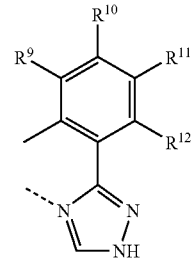

(1h)

(1i)

wherein $R^9$ to $R^{12}$ are each independently a hydrogen atom, a halogen atom, a cyano group, a C1-10 alkyl group, an amino group optionally substituted with a C1-10 alkyl group, a C1-10 alkoxy group, or a silyl group optionally substituted with a C1-10 alkyl group.

In the compound of Formula (1), the LUMO (lowest unoccupied molecular orbital) energy level in the five-membered ring of the ligand L is higher than the LUMO energy level in the pyridine of the phenylpyridine ring. For example, according to molecular orbital calculation using the density functional theory (B3LYP), the LUMO energy level of pyridine is −0.6117 eV, whereas those of imidazol, pyrazole and 1,2,4-triazole are 0.8798 eV, 0.6743 eV and 0.2212 eV, respectively. Because the five-membered rings of the ligands L have a relatively high LUMO energy level, the excited electrons in the excited iridium complex are concentrated in the phenylpyridine ring in the compound of Formula (1) and therefore the ligands L will not emit light.

In the compound of Formula (1), the emitting ligand in the iridium complex structure is limited to one ligand (phenylpyridine ring) that will be bonded to the main chain of the polymer compound. It is probably due to this limitation that the organic EL devices manufactured with the compound of Formula (1) surpass conventional organic EL devices in luminance efficiency and life.

($R^1$ to $R^8$)

Referring to $R^1$ to $R^8$, Examples of the halogen atoms include fluorine, chlorine, bromine and iodine atoms.

Examples of the C1-10 alkyl groups include methyl, ethyl, propyl, isopropyl, butyl, isobutyl, t-butyl, amyl, hexyl, octyl and decyl groups.

Examples of the C6-10 aryl groups include phenyl, tolyl, xylyl, mesityl and naphthyl groups.

Examples of the C1-15 heteroaryl groups include pyridyl, pyrazyl, quinolyl, isoquinolyl, pyrrolyl, imidazolyl, pyrazolyl, oxazolyl, oxadiazolyl, thiazolyl, benzoxazolyl, benzothiazolyl, thienyl, furyl, carbazolyl and tetrazol groups.

Examples of the amino groups optionally substituted with a C1-10 alkyl group include amino, dimethylamino, diethylamino and dibutylamino groups.

Examples of the C1-10 alkoxy groups include methoxy, ethoxy, propoxy, isopropoxy, butoxy, isobutoxy, t-butoxy, hexyloxy, 2-ethylhexyloxy and decyloxy groups.

Examples of the silyl groups optionally substituted with a C1-10 alkyl group include trimethylsilyl, triethylsilyl, t-butyldimethylsilyl and trimethoxysilyl groups.

Examples of the radically polymerizable functional groups include allyl, alkenyl (e.g., vinyl, 2-propenyl), styryl, acryloyloxy and methacryloyloxy groups, with the vinyl, styryl, acryloyloxy and methacryloyloxy groups being preferred.

One of $R^1$ to $R^8$ is a group having the radically polymerizable functional group.

Preferably, $R^1$ to $R^8$ are each independently a hydrogen atom, a fluorine atom, a cyano group, a methyl group, a t-butyl group, a dimethylamino group or a methoxy group. In more detail, from the viewpoints of efficiency and life of organic EL devices, one or more of $R^2$, $R^3$, $R^6$ and $R^7$ in Formula (1) are preferably each independently a fluorine atom, a cyano group, a methyl group, a t-butyl group or a methoxy group, and the remaining groups of $R^1$ to $R^8$ other than the above group(s) and group (s) having the radically polymerizable functional group are preferably each a hydrogen atom. Also preferably, either or both of $R^2$ and $R^3$ are each independently a methyl group or a t-butyl group, and the remaining groups of $R^1$ to $R^8$ other than the above group(s) and group(s) having the radically polymerizable functional group are each a hydrogen atom.

The groups having the radically polymerizable functional group may have a divalent group between the radically polymerizable functional group and the carbon atom on the benzene or pyridine ring coordinated to iridium. Such divalent groups are hereinafter referred to as spacers. Examples of the spacers include saturated hydrocarbon chains and hydrocarbon chains having heteroatoms. To make sure that the ligand is located near the polymer main chain, the spacer preferably has the longest chain composed of 1 to 5 atoms. Examples of the groups having the radically polymerizable functional group with the spacer include those represented by Formulae (a1) to (a8) below:

(a1)

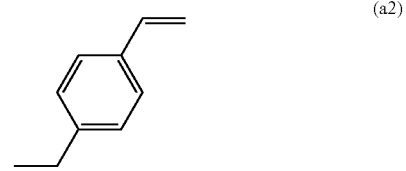

(a2)

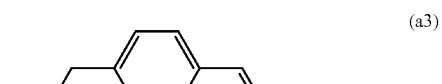

(a3)

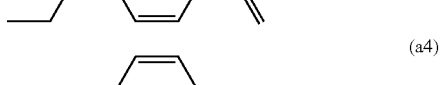

(a4)

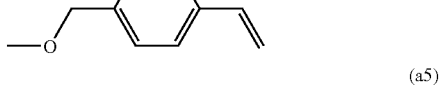

(a5)

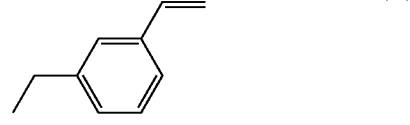

(a6)

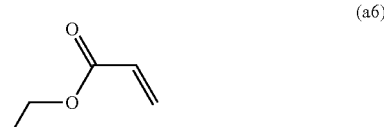

(a7)

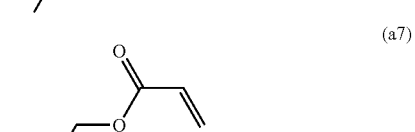

(a8)

($R^9$ to $R^{12}$)

Referring to $R^9$ to $R^{12}$, Examples of the halogen atoms include fluorine, chlorine, bromine and iodine atoms.

Examples of the C1-10 alkyl groups include methyl, ethyl, propyl, isopropyl, butyl, isobutyl, t-butyl, amyl, hexyl, octyl and decyl groups.

Examples of the amino groups optionally substituted with a C1-10 alkyl group include amino, dimethylamino, diethylamino and dibutylamino groups.

Examples of the C1-10 alkoxy groups include methoxy, ethoxy, propoxy, isopropoxy, butoxy, isobutoxy, t-butoxy, hexyloxy, 2-ethylhexyloxy and decyloxy groups.

Examples of the silyl groups optionally substituted with a C1-10 alkyl group include trimethylsilyl, triethylsilyl, t-butyldimethylsilyl and trimethoxysilyl groups.

Preferably, $R^9$ to $R^{12}$ are each independently a hydrogen atom, a fluorine atom, a cyano group, a methyl group, a t-butyl group, a dimethylamino group or a methoxy group. In more detail, from the viewpoints of efficiency and life of organic EL devices, either or both of $R^{10}$ and $R^{11}$ in Formulae (1a) to (1i) are preferably each independently a methyl group, a t-butyl group or a methoxy group, and the remaining groups of $R^9$ to $R^{12}$ other than the above group(s) are preferably each a hydrogen atom.

(Five-Membered Ring)

In the five-membered ring of the ligand L, the substituent groups on the carbon atoms may be a fluorine atom, a cyano group, a C1-10 alkyl group, a C1-10 alkoxy group or a trifluoromethyl group. Of these, a fluorine atom or a C1-10 alkyl group is preferable. The substituent groups on the nitrogen atoms in the five-membered ring are preferably C1-10 alkyl groups.

(Process for Producing Compounds of Formula (1))

The compounds represented by Formula (1) may be produced by a process including the following steps (i) and (ii):

Step (i):

A compound L' represented by any of Formulae (1a') to (1i') below is reacted with iridium chloride trihydrate (IrCl$_3$ (H$_2$O)$_3$) to give a compound represented by Formula (α) below.

Step (ii):

The compound of Formula (α) is reacted with a compound represented by Formula (β) below in the presence of silver trifluoromethanesulfonate to produce the compound represented by Formula (1).

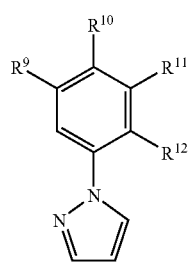
(1 a')

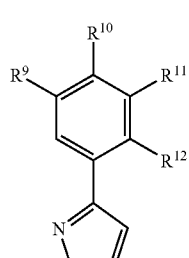
(1 b')

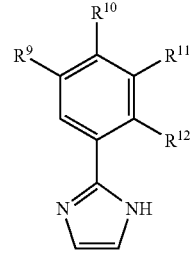
(1 c')

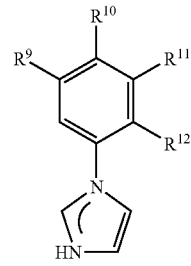
(1 d')

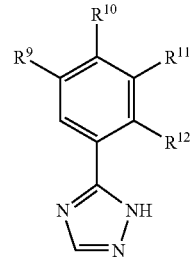
(1 e')

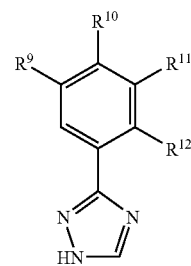
(1 f')

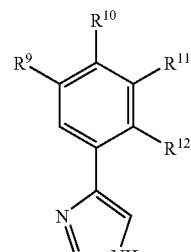
(1 g')

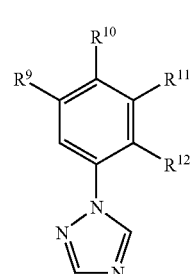
(1 h')

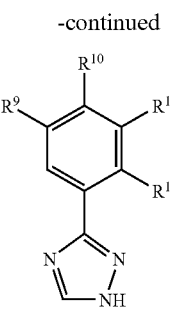
(1i')

In Formulae (1a') to (1i'), $R^9$ to $R^{12}$ are as defined in Formulae (1a) to (1i), and the five-membered rings may have substituents such as C1-10 alkyl groups, amino groups optionally substituted with a C1-10 alkyl group, and C1-10 alkoxy groups.

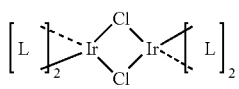
(α)

In Formula (α), L is as defined in Formula (1).

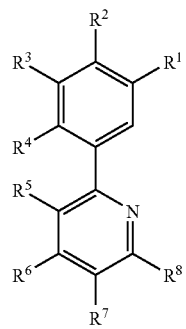
(β)

In Formula (β), $R^1$ to $R^8$ are as defined in Formula (1).

Charge-Transporting Units

The phosphorescent polymer compound may contain structural units derived from at least one of hole-transporting polymerizable compounds and electron-transporting polymerizable compounds. The hole-transporting polymerizable compounds and electron-transporting polymerizable compounds will be collectively referred to as the charge-transporting polymerizable compounds.

The phosphorescent polymer compound preferably contains structural units derived from one or more hole-transporting polymerizable compounds or structural units derived from one or more electron-transporting polymerizable compounds. This polymer compound may be applied by a coating technique to form a uniform emitting layer which has high electric charge mobility and high luminance efficiency.

More preferably, the phosphorescent polymer compound contains structural units derived from one or more hole-transporting polymerizable compounds and structural units derived from one or more electron-transporting polymerizable compounds. With hole-transporting properties and electron-transporting properties, this phosphorescent polymer compound allows for more efficient recombination of holes and electrons in the vicinity of the compound, thus providing higher luminance efficiency.

The hole-transporting polymerizable compounds and electron-transporting polymerizable compounds are not particularly restricted except that they have substituent groups with polymerizable functional groups. Known charge-transporting compounds may be used.

The polymerizable functional groups may refer to radically polymerizable functional groups.

Examples of the polymerizable functional groups include allyl, alkenyl, acryloyloxy, methacryloyloxy, urethane(meth)acryloyloxy (e.g., methacryloyloxyethyl carbamate) and vinylamide groups, and derivatives of these groups. Of these, the alkenyl groups are preferred.

In detail, Formulae (A1) to (A12) below illustrate preferred examples of the substituent groups with the polymerizable functional groups that are the alkenyl groups. Of these substituent groups, those of Formulae (A1), (A5), (A8) and (A12) are more preferred because the polymerizable functional groups are easily introduced in the charge-transporting compounds.

(A1)

(A2)

(A3)

(A4)

(A5)

(A6)

(A7)

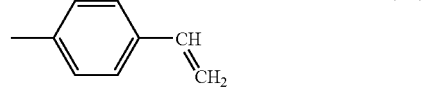

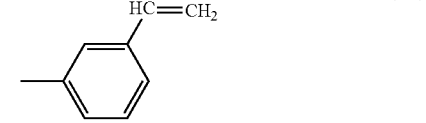

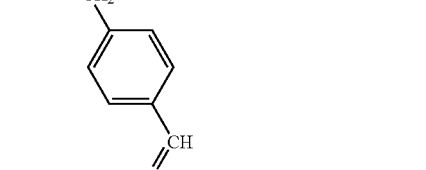

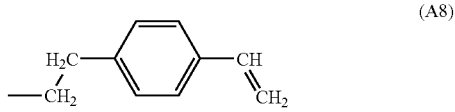
(A8)

(A9)
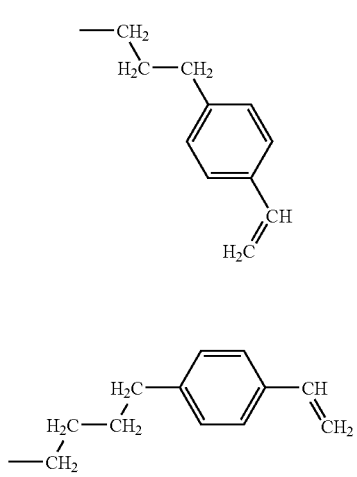
(A10)
(A11)
(A12)
Formulae (E1) to (E6) below illustrate preferred examples of the hole-transporting polymerizable compounds. Of these, the compounds of Formulae (E1) to (E3) are more preferred in terms of electric charge mobility in the non-conjugated polymer compounds.
(E2)
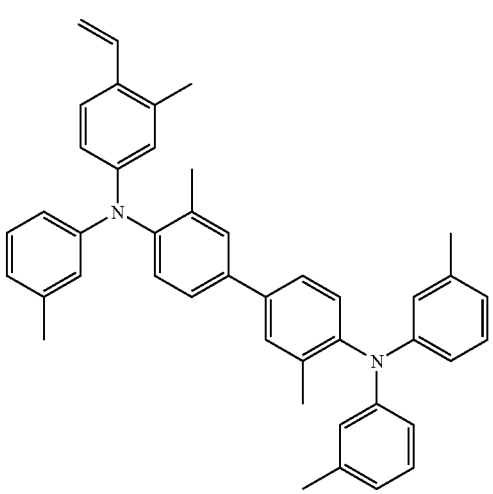
(E3)
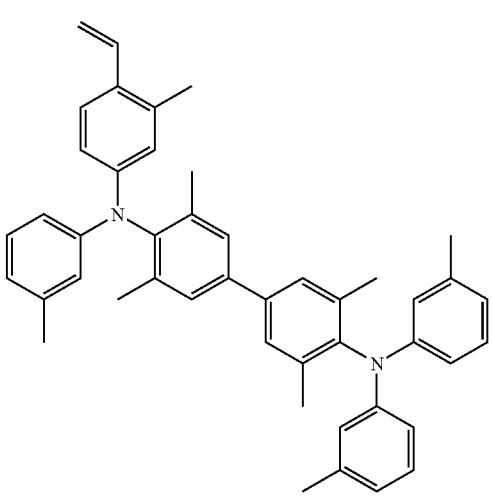
(E1)
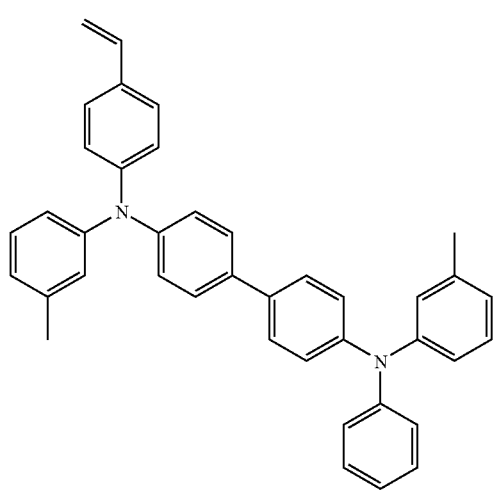
(E4)
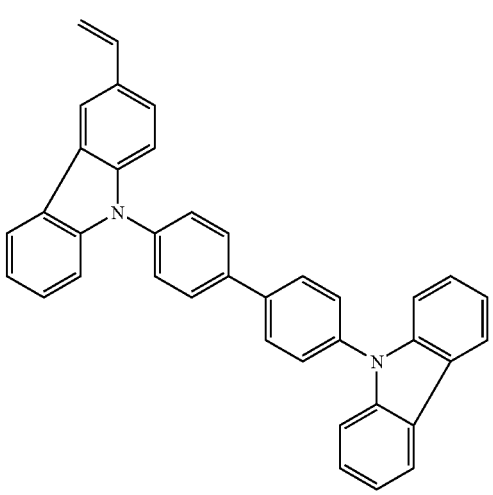

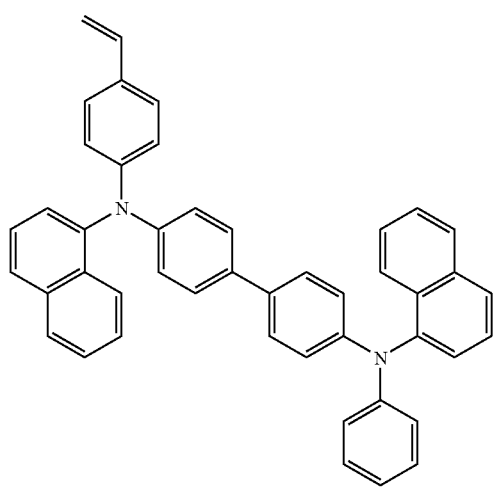
(E5)
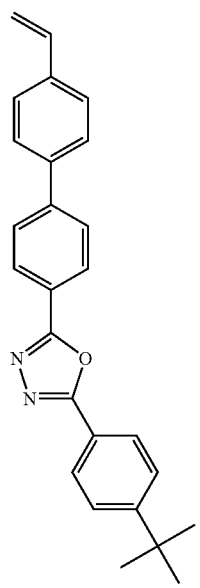
(E7)
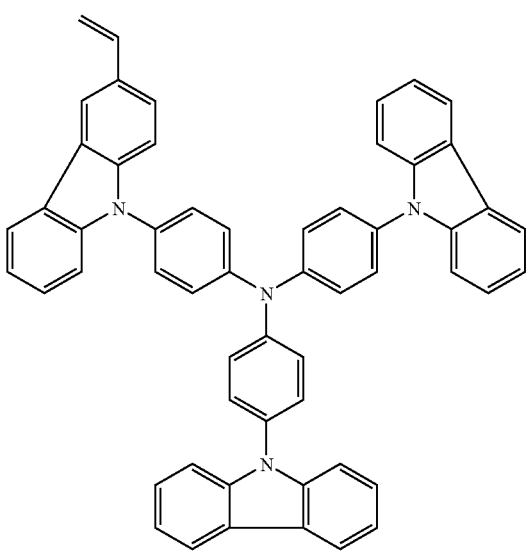
(E6)
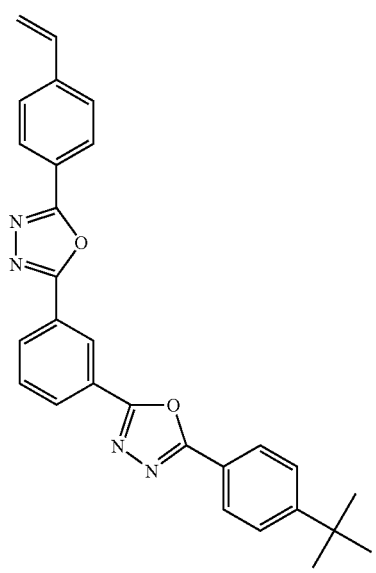
(E8)
Formulae (E7) to (E15) below illustrate preferred examples of the electron-transporting polymerizable compounds. Of these, the compounds of Formulae (E7) and (E12) to (E14) are more preferred in terms of electric charge mobility in the non-conjugated polymer compounds.

(E9)
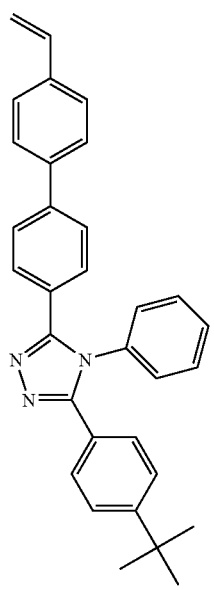
(E10)
(E11)
(E12)
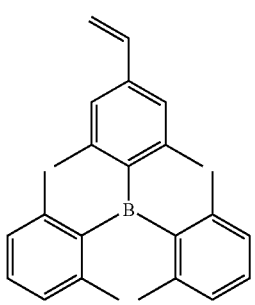
(E13)
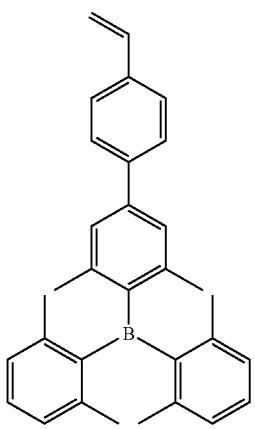
(E14)
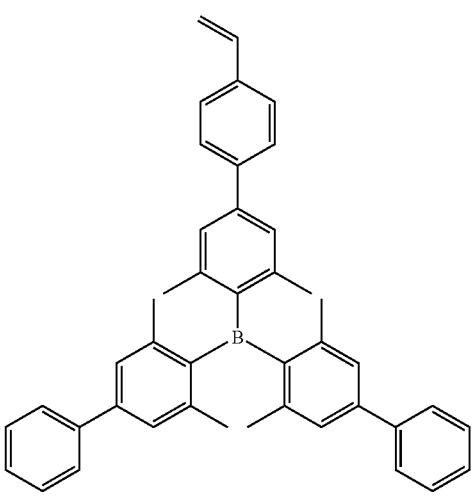

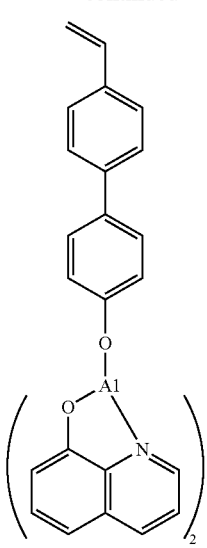

(E15)

In Formulae (E1) to (E15), the substituent group represented by Formula (A1) may be replaced by the substituent groups represented by Formulae (A2) to (A12). In particular, the compounds having the substituent groups represented by Formulae (A1) and (A5) are preferable because the functional groups are easily introduced in the polymerizable compounds.

Of the hole-transporting polymerizable compounds, those of Formulae (E1) to (E3) are more preferable. Of the electron-transporting polymerizable compounds, those of Formulae (E7) and (E12) to (E14) are more preferable. With these polymerizable compounds, holes and electrons recombine on the phosphorescent polymer compound more efficiently and higher luminance efficiency is achieved. The charge-transporting polymerizable compounds together with the phosphorescent compound form an organic layer having a uniform composition. Organic EL devices including such organic layer show excellent durability.

Phosphorescent Polymer Compounds

The phosphorescent polymer compound may be an oligomer compound or a polymer compound. The phosphorescent polymer compound preferably has a weight-average molecular weight of 1,000 to 5,000,000, more preferably 2,000 to 1,000,000, still more preferably 3,000 to 100,000. As used herein, the molecular weight is measured by GPC (gel permeation chromatography) relative to polystyrene standards. When the molecular weight is in the above range, the polymer is soluble inorganic solvents and gives uniform films.

The polymer compound may attain desired properties by appropriately controlling the amounts of the iridium complex and the charge-transporting polymerizable compound (hole-transporting polymerizable compound and/or electron-transporting polymerizable compound). The polymer compound may be a random copolymer, a block copolymer or an alternating copolymer.

Assume that the letter m represents the number of structural units derived from the iridium complex in the polymer compound, and the letter n represents the number of structural units derived from the charge-transporting compound (the total structural units derived from the hole-transporting polymerizable compound and/or the electron-transporting polymerizable compound) (m and n are integers of 1 or greater). The ratio of the iridium complex-derived structural units to the total structural units, namely, the ratio $m/(m+n)$, is preferably in the range of 0.001 to 0.5, more preferably 0.001 to 0.2. When the ratio $m/(m+n)$ is within the range, the electric charge mobility is high and the concentration quenching is small, in other words, organic EL devices show high luminance efficiency.

As already mentioned, the polymer compound may include structural units derived from the hole-transporting compound and structural units derived from the electron-transporting compound. Here, assume that the letter x represents the number of structural units from the hole-transporting compound, and the letter y represents the number of structural units from the electron-transporting compound (x and y are integers of 1 or greater). These and the above n have the following relation: $n=x+y$. An optimum ratio of the structural units from the hole-transporting compound to the total structural units derived from the charge-transporting compounds, namely, an optimum ratio x/n, and an optimum ratio of the structural units from the electron-transporting compound to the total structural units derived from the charge-transporting compounds, namely, an optimum ratio y/n, are variable depending on the charge-transporting capacity of each of the structural units, and the charge-transporting capacity and concentration of the structural units from the iridium complex. In the case where this polymer is the only compound to form the emitting layer of the organic EL device, the ratio x/n and the ratio y/n are preferably each 0.05 to 0.95, more preferably 0.20 to 0.80, wherein $x/n+y/n=1$.

The phosphorescent polymer compound may contain structural units derived from other polymerizable compounds while still achieving the advantages of the invention. Examples of such polymerizable compounds include, but are not limited to, compounds without charge-transporting properties such as alkyl(meth)acrylates such as methyl acrylate and methyl methacrylate, styrene and derivatives thereof.

The polymer compound is preferably produced by radical polymerization.

(Process for Manufacturing Organic EL Devices)

An embodiment of an organic EL device according to the present invention is shown in FIG. 1. However, the constitution of the organic EL devices of the invention is not limited thereto. In FIG. 1, an anode (2) is formed on a transparent substrate (1). Between the anode (2) and a cathode (6), a hole-transporting layer (3), an emitting layer (4) and an electron-transporting layer (5) are provided in this order. In another embodiment of the organic EL device, 1) the hole-transporting layer and the emitting layer, or 2) the emitting layer and the electron-transporting layer may be provide between the anode (2) and the cathode (6). In a still another embodiment, 3) a layer including a hole-transporting material, an emitting material and an electron-transporting material, 4) a layer including a hole-transporting material and an emitting material, and 5) a layer including an emitting material and an electron-transporting material may be formed singly or in combination of two or more kinds between the electrodes.

An organic compound layer containing the phosphorescent polymer compound that has the phosphorescent sites and charge-transporting sites is an emitting layer having both hole-transporting properties and electron-transporting properties. In other words, organic EL devices of high luminance efficiency are manufactured using the organic compound layer without other layers of organic compound materials.

(Substrate)

For use in the organic EL devices of the invention, insulating substrates that are transparent at wavelengths of light emitted from the emitting material are suitably used. Specific examples include glass, and transparent plastics such as PET (polyethyleneterephthalate) and polycarbonates.

(Process for Producing Organic Compound Layers)

The organic compound layers may be produced by any methods without limitation. An exemplary method is given below. First, the phosphorescent polymer compound is dissolved in a solvent to give a solution. The solvents used herein are not particularly limited, and examples thereof include chlorine solvents such as chloroform, methylene chloride and dichloroethane; ether solvents such as tetrahydrofuran and anisole; aromatic hydrocarbon solvents such as toluene and xylene; ketone solvents such as acetone and methyl ethyl ketone; and ester solvents such as ethyl acetate, butyl acetate and ethyl cellosolve acetate. The solution is then spread on a base by inkjet printing, spin coating, dip coating or printing, thereby forming the organic compound layer. The concentration of the solution depends on the compounds used and film-forming conditions. For example, for the spin coating or dip coating, the concentration is preferably 0.1 to 10 wt %. The organic layer may be formed easily as described above, leading to simplified production steps and the increasing of area of EL devices.

(Other Materials)

The organic compound layers may contain polymer materials as binders. Examples of the polymer materials include polymethyl methacrylates, polycarbonates, polyesters, polysulfones and polyphenyleneoxides.

The organic compound layers may be formed of a material that is a mixture of materials with different functions, for example emitting materials, hole-transporting materials and electron-transporting materials. The organic compound layer containing the phosphorescent polymer compound may contain another hole-transporting material and/or electron-transporting material to increase charge-transporting properties. Such charge-transporting materials may be low molecular-weight compounds or high molecular-weight compounds.

A hole-injection layer may be provided between the anode and the emitting layer to reduce the injection barrier and facilitate hole injection. The hole-injection layer may be produced using known materials such as copper phthalocyanine, polyethylenedioxythiophene (PEDOT)/polystyrenesulfonic acid (PSS) mixture, and fluorocarbons.

To improve electron injection efficiency, an insulating layer 0.1 to 10 nm in thickness may be formed between the cathode and the electron-transporting layer or between the cathode and an organic compound layer adjacent to the cathode. The insulating layer may be formed using known materials such as lithium fluoride, sodium fluoride, magnesium fluoride, magnesium oxide and alumina.

Examples of the hole-transporting materials to form the hole-transporting layer or to be mixed in the emitting layer include TPD (N,N'-dimethyl-N,N'-(3-methylphenyl)-1,1'-biphenyl-4,4'-diamine); α-NPD (4,4'-bis[N-(1-naphthyl)-N-phenylamino]biphenyl); low-molecular triphenylamine derivatives such as m-MTDATA (4,4',4"-tris(3-methylphenylphenylamino)triphenylamine); polyvinylcarbazole; high molecular-weight compounds obtained by introducing polymerizable substituent groups in the above triphenylamine derivatives followed by polymerization; and phosphorescent polymer compounds such as polyparaphenylenevinylene and polydialkylfluorene. The high molecular-weight compounds include compounds with triphenylamine skeletons disclosed in JP-A-H08-157575. The hole-transporting materials may be used singly or two or more kinds may be used in combination. The hole-transporting materials may form respective layers that are laminated. The thickness of the hole-transporting layer is not particularly limited and is variable depending on the conductivity of the hole-transporting layer. But the thickness is preferably in the range of 1 nm to 5 μm, more preferably 5 nm to 1 μm, particularly preferably 10 nm to 500 nm.

Examples of the electron-transporting materials to form the electron-transporting layer or to be mixed in the emitting layer include low molecular-weight compounds such as quinolinol derivatives such as Alq3 (aluminum trisquinolinolate), oxadiazole derivatives, triazole derivatives, imidazole derivatives, triazine derivatives and triarylborane derivatives; and high molecular-weight compounds obtained by introducing polymerizable functional groups to the above low molecular-weight compounds followed by polymerization. The high molecular-weight compounds include poly (PBD) disclosed in JP-A-H10-1665. The electron-transporting materials may be used singly or two or more kinds may be used in combination. The electron-transporting materials may form respective layers that are laminated. The thickness of the electron-transporting layer is not particularly limited and is variable depending on the conductivity of the electron-transporting layer. But the thickness is preferably in the range of 1 nm to 5 μm, more preferably 5 nm to 1 μm, particularly preferably 10 nm to 500 nm.

To inhibit holes from passing through the emitting layer and thereby to ensure efficient recombination of holes and electrons in the emitting layer, a hole-blocking layer may be provided on the emitting layer on the cathode side. The hole-blocking layer may be produced using known materials such as triazole derivatives, oxadiazole derivatives and phenanthroline derivatives.

The methods for producing the hole-transporting layers and electron-transporting layers include dry film-forming methods such as resistance heating deposition, electron beam deposition and sputtering; and wet film-forming methods such as spin coating, casting, microgravure coating, gravure coating, bar coating, roll coating, wire bar coating, dip coating, spray coating, screen printing, flexographic printing, offset printing and inkjet printing. The dry film-forming methods are suitable for low molecular-weight compounds, and the wet film-forming methods are suitable for high molecular-weight compounds.

(Materials and Production of Anode and Cathode)

Examples of preferred anode materials for use in the organic EL devices include known transparent conductive materials such as ITO (indium tin oxide), tin oxide, zinc oxide and conductive polymers such as polythiophene, polypyrrole and polyaniline. The electrode formed of the transparent conductive material preferably has a surface resistance of 1 to 50Ω/□ (ohms per square). The thickness of the anode is preferably 50 to 300 nm.

Examples of preferred cathode materials for use in the organic EL devices include known cathode materials such as alkali metals such as Li, Na, K and Cs; alkaline earth metals such as Mg, Ca and Ba; Al; MgAg alloy; and alloys of Al and alkali metals or alkaline earth metals such as AlLi and AlCa. The thickness of the cathode is preferably 10 nm to 1 μm, more preferably 50 to 500 nm. When the cathode is formed using highly active metals such as alkali metals and alkaline earth metals, the thickness of the cathode is preferably 0.1 to 100 nm, more preferably 0.5 to 50 nm. In this case, a metal layer that is stable in air is laminated on the cathode to protect the cathode metal. Examples of the protective metals include Al, Ag, Au, Pt, Cu, Ni and Cr. The thickness of the protective metal layer is preferably 10 nm to 1 μm, more preferably 50 to 500 nm.

The methods for producing the anode include electron beam deposition, sputtering, chemical reactions and coating.

The methods for forming the cathode include resistance heating deposition, electron beam deposition, sputtering and ion plating.

(Applications of Organic EL Devices)

The organic EL devices of the present invention are suitably used as pixels in display apparatuses of matrix system or segment system according to conventional techniques. The organic EL devices are also suitable as area light sources without forming pixels.

The organic EL devices find applications in displays, backlights, electrophotographic systems, illuminating light sources, recording light sources, exposing sources, reading light sources, sings, advertising displays, interior accessories and optical communication systems.

EXAMPLES

The present invention will be described in detail by examples without limiting the scope of the invention.

The polymer compounds were analyzed by the following methods.

(1) Molecular Weight

The molecular weight was measured with a gel permeation chromatograph (GPC) under the following conditions.
Columns: Shodex KF-G, KF804L, KF802 and KF801
Eluting solvent: Tetrahydrofuran (THF)
Temperature: 40° C.
Detector: RI (Shodex RI-71)

(2) Composition Analysis $^{1}$H-NMR and $^{13}$C-NMR analyses were performed under the following conditions.
Apparatus: JNM EX270 manufactured by JEOL Ltd.
67.5 MHz
Solvent: Deuterated chloroform (CDCl$_3$)

ICP elemental analysis was performed under the following conditions.
Apparatus: ICPS 8000 manufactured by Shimadzu Corporation Mass spectroscopy (ESI) was performed under the following conditions.

Spectrometer: LCQ Advantage manufactured by ThermoQuest Corp.
Flow solvent: Acetonitrile (0.5 ml/min)

The organic EL devices were tested for external quantum efficiency, maximum brightness and luminance half life by the following methods.

(3) Maximum External Quantum Efficiency (%)

The organic EL device was placed in the dark. A spectroradiometer (CS-1000T manufactured by Konica Minolta Holdings, Inc.) was located 100 cm away from the emitting surface in a perpendicular direction. A predetermined voltage was applied to the organic EL device for 1 second to cause the device to emit light. The current passing through the device, the front brightness observed on the anode side of the device, and an emission spectrum were measured at a viewing angle of 0.2 degree. The voltage was increased stepwise by 0.1 V starting from 0 V. The current, brightness and emission spectrum were measured immediately after the voltage was increased. The external quantum efficiency was calculated from the data obtained, and the maximum value was determined as the external quantum efficiency of the device.

(4) Maximum Brightness (cd/m$^2$)

The front brightness was measured in the same manner as the measurement of the maximum external quantum efficiency, except that the voltage was increased stepwise by 0.5 V. The maximum value was determined as the maximum brightness of the device.

(5) Luminance Half Life (h)

The EL device was energized in the same manner as described in the measurement of the maximum external quantum efficiency while measuring the front brightness, and the EL device was energized to a brightness of 100 cd/m$^2$. A silicon photodiode was attached to the device on the anode side. While the current was maintained constant, the photocurrent through the photodiode was measured. The time required until the photocurrent was reduced by half was determined as the luminance half life.

Synthetic Example 1

Synthesis of Iridium Complex (1)

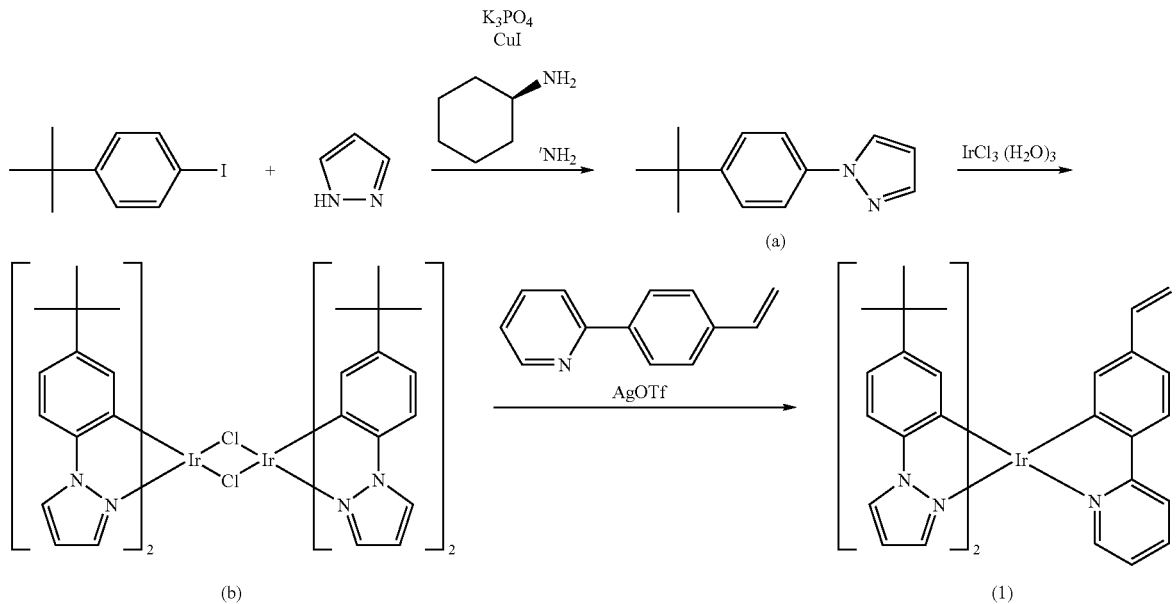

5.166 g (19.9 mmol) of 4-t-butyliodobenzene, 1.50 g (22.0 mmol) of pyrazole, 8.51 g (40.1 mmol) of tripotassium phosphate, 78 mg (0.41 mmol) of copper (I) iodide, 237 mg (2.08 mmol) of trans-1,2-cyclohexanediamine and 30 ml of dioxane were stirred together at 110° C. for 22 hours. The resultant reaction liquid was filtered through a glass filter, and the solvent was evaporated under reduced pressure. The residue was purified by silica gel column chromatography (eluting solvent: chloroform), and 2.7 g (13.5 mmol) of a compound (a) was obtained (68% yield).

Subsequently, 1.004 g (5.01 mmol) of the compound (a), 0.846 g (2.40 mmol) of iridium chloride trihydrate, 21 ml of 2-ethoxyethanol and 7 ml of water were mixed and heated under reflux for 12 hours. The resultant reaction liquid was combined with a small amount of water, and the precipitated product was filtered off, washed with methanol and dried under reduced pressure to afford 1.4 g (1.1 mmol) of an iridium complex (b) (92% yield).

Thereafter, 3.96 g (3.16 mmol) of the iridium complex (b), 1.30 g (7.2 mmol) of 2-(4-vinylphenyl)pyridine (synthesized according to a method disclosed in JP-A-2002-293830), 1.70 g (6.62 mmol) of silver trifluoromethanesulfonate and 300 ml of toluene were mixed and heated under reflux for 3 hours. The resultant reaction liquid was filtered through Celite, and the solvent was evaporated under reduced pressure. The residue was purified by silica gel column chromatography (eluting solvent: toluene). As a result, 0.60 g (0.78 mmol) of an iridium complex (1) was obtained (12% yield).

The identification data of the iridium complex (1) are as follows.

$^1$H-NMR (CDCl$_3$): 7.9-6.8 (17H), 6.52 (1H), 6.35 (2H), 5.51 (1H), 5.04 (1H), 1.12 (9H), 1.10 (9H)

Elemental analysis:
theoretical values (C$_{39}$H$_{40}$IrN$_5$): C, 60.76; H, 5.23; N, 9.08.
measured values: C, 60.55; H, 5.19; N, 9.52.

Mass spectroscopy (ESI): 771 (M$^+$)

Synthetic Example 2

Synthesis of Iridium Complex (2)

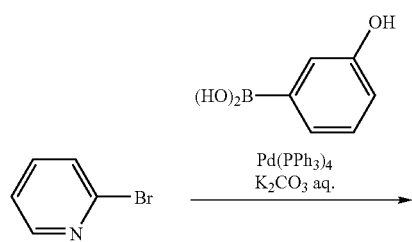

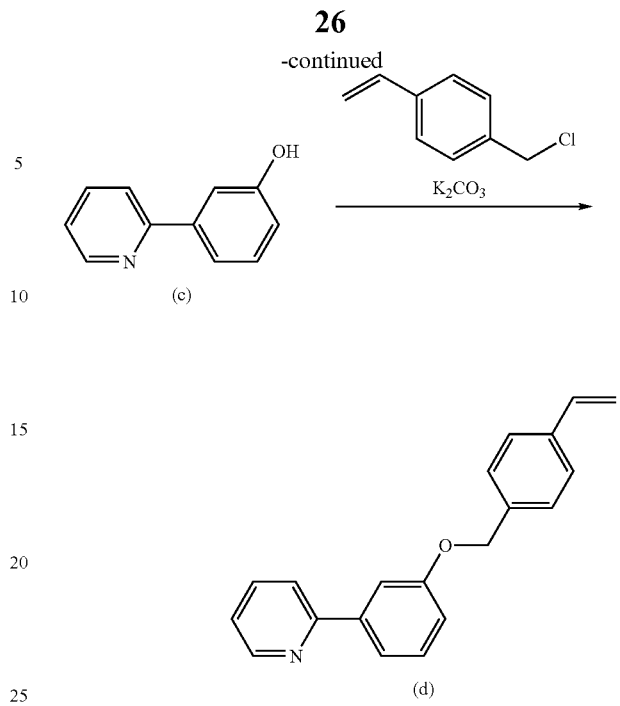

10.5 g (66 mmol) of 2-bromopyridine, 9.2 g (67 mmol) of 3-hydroxyphenylboronic acid, 1.0 g (0.87 mmol) of tetrakis(triphenylphosphine)palladium and 100 ml of 1,2-dimethoxyethane were mixed together. To the mixture, 100 ml of an aqueous solution of 27.0 g (195 mmol) of potassium carbonate was added, and the mixture was stirred with heating for 5 hours. To the reaction mixture obtained, a 2N aqueous hydrochloric acid solution was added to adjust the pH of the aqueous phase to approximately 7. The organic phase was extracted with ethyl acetate. The solvent was evaporated from the extract under reduced pressure. The residue was purified by silica gel column chromatography (eluting solvent: chloroform/ethyl acetate=1/1), and 9.6 g (56 mmol) of a compound (c) was obtained (85% yield).

Subsequently, 5.8 g (34 mmol) of the compound (c), 6.0 g (39 mmol) of 4-vinylbenzyl chloride, 8.5 g (62 mmol) of potassium carbonate and 100 ml of acetone were mixed and heated under reflux for 24 hours. The resultant reaction mixture was filtered through Celite, and the solvent was evaporated under reduced pressure. The residue was purified by silica gel column chromatography (eluting solvent: chloroform/ethyl acetate=10/1), and 7.1 g (25 mmol) of a compound (d) was obtained (73% yield).

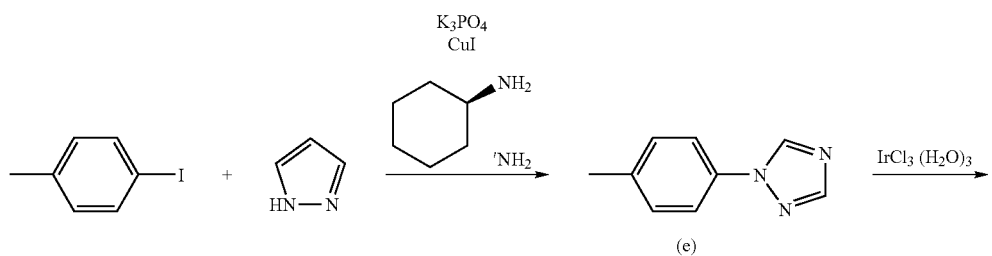

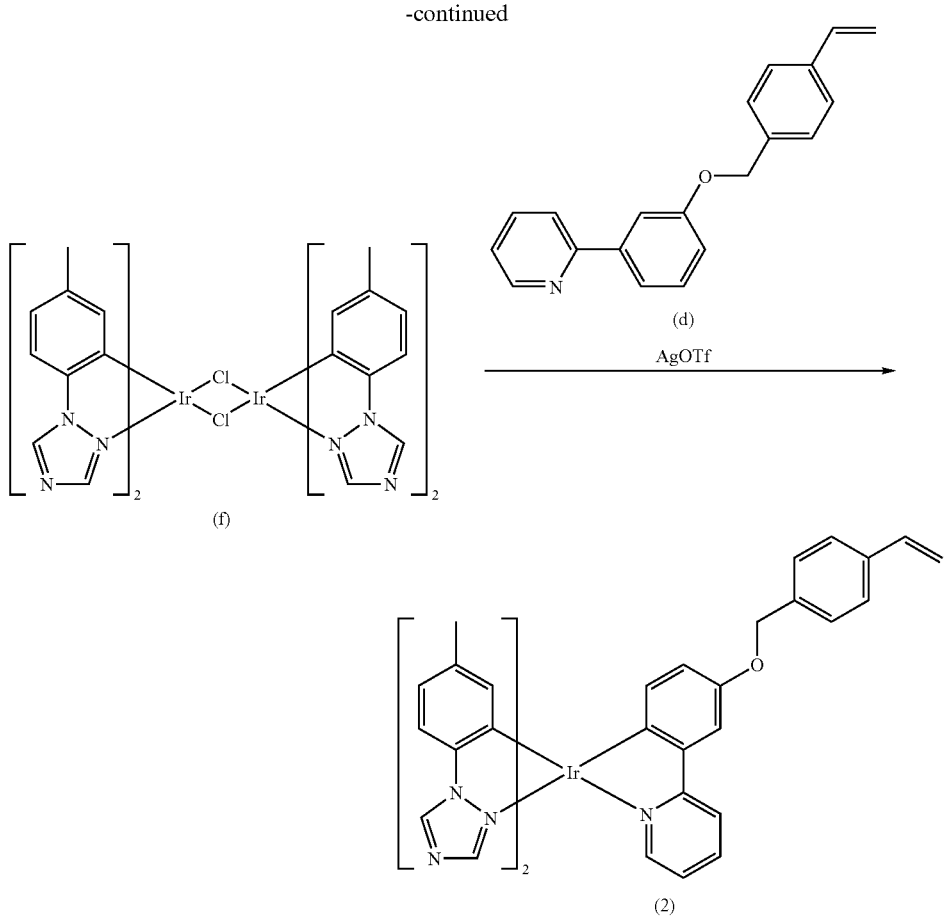

8.0 g (37 mmol) of 4-iodotoluene, 3.0 g (43 mmol) of 1,2,4-triazole, 15 g (71 mmol) of tripotassium phosphate, 90 mg (0.47 mmol) of copper (I) iodide, 250 mg (2.2 mmol) of trans-1,2-cyclohexanediamine and 40 ml of dioxane were stirred together at 110° C. for 24 hours. The resultant reaction liquid was filtered through a glass filter, and the solvent was evaporated under reduced pressure. The residue was purified by silica gel column chromatography (eluting solvent: chloroform), and 3.6 g (23 mmol) of a compound (e) was obtained (61% yield).

Subsequently, 2.50 g (16 mmol) of the compound (e), 2.55 g (7.2 mmol) of iridium chloride trihydrate, 30 ml of 2-ethoxyethanol and 10 ml of water were mixed and heated under reflux for 12 hours. The resultant reaction liquid was combined with a small amount of water, and the precipitated product was filtered off, washed with methanol and dried under reduced pressure to afford 3.7 g (3.4 mmol) of an iridium complex (f) (94% yield).

Thereafter, 2.9 g (2.7 mmol) of the iridium complex (f), 1.9 g (6.6 mmol) of the compound (d), 1.7 g (6.6 mmol) of silver trifluoromethanesulfonate and 150 ml of toluene were mixed and heated under reflux for 3 hours. The resultant reaction liquid was filtered through Celite, and the solvent was evaporated under reduced pressure. The residue was purified by silica gel column chromatography (eluting solvent: dichloromethane). As a result, 0.50 g (0.63 mmol) of an iridium complex (2) was obtained (12% yield).

The identification data of the iridium complex (2) are as follows.

$^1$H-NMR (CDCl$_3$): 8.5-7.0 (21H), 6.71 (1H), 5.72 (1H), 5.21 (1H), 4.86 (2H), 2.29 (3H), 2.25 (3H)

Elemental analysis:
theoretical values (C$_{38}$H$_{32}$IrN$_7$O): C, 57.42; H, 4.06, N: 12.33.

measured values: C, 57.80; H, 3.94; N, 12.08.

Mass spectroscopy (ESI): 795 (M$^+$)

Synthetic Example 3

Synthesis of Iridium Complex (3)

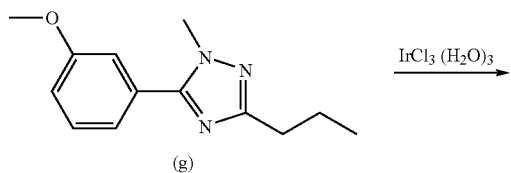

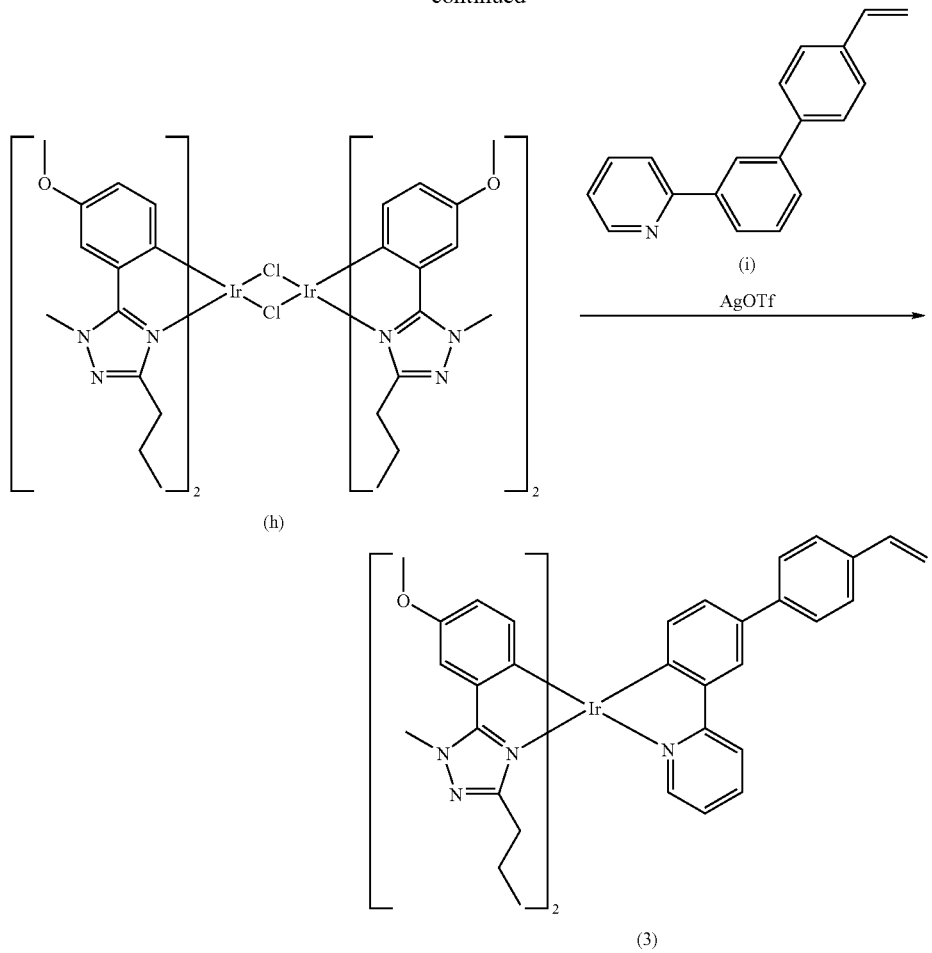

(h)

(3)

4.0 g (17 mmol) of a compound (g) (synthesized according to a method described in Chemistry of Materials, Vol. 18, pp. 5119-5129, 2006), 3.0 g (8.5 mmol) of iridium chloride trihydrate, 45 ml of 2-ethoxyethanol and 15 ml of water were mixed and heated under reflux for 12 hours. The resultant reaction liquid was combined with a small amount of water, and the precipitated product was filtered off, washed with methanol and dried under reduced pressure to afford 5.0 g (3.6 mmol) of an iridium complex (h) (85% yield).

Thereafter, 3.5 g (2.5 mmol) of the iridium complex (h), 1.5 g (5.8 mmol) of a compound (i) (synthesized according to a method disclosed in JP-A-2006-8996), 1.5 g (5.8 mmol) of silver trifluoromethanesulfonate and 150 ml of toluene were mixed and heated under reflux for 3 hours. The resultant reaction liquid was filtered through Celite, and the solvent was evaporated under reduced pressure. The residue was purified by silica gel column chromatography (eluting solvent: dichloromethane). As a result, 0.40 g (0.44 mmol) of an iridium complex (3) was obtained (9% yield).

The identification data of the iridium complex (3) are as follows.

$^1$H-NMR (CDCl$_3$): 8.0-6.9 (13H), 6.77 (1H), 6.50 (4H), 5.76 (1H), 5.21 (1H), 4.20 (6H), 3.65 (6H), 2.22 (2H), 1.90 (2H), 1.35 (2H), 1.14 (2H), 0.66 (6H)

Elemental analysis:

theoretical values (C$_{45}$H$_{46}$IrN$_7$O): C, 59.45; H, 5.10, N: 10.78.

measured values: C, 59.32; H, 4.97; N, 10.51.

Mass spectroscopy (ESI): 909 (M$^+$)

Synthetic Example 4

Synthesis of Iridium Complex (4)

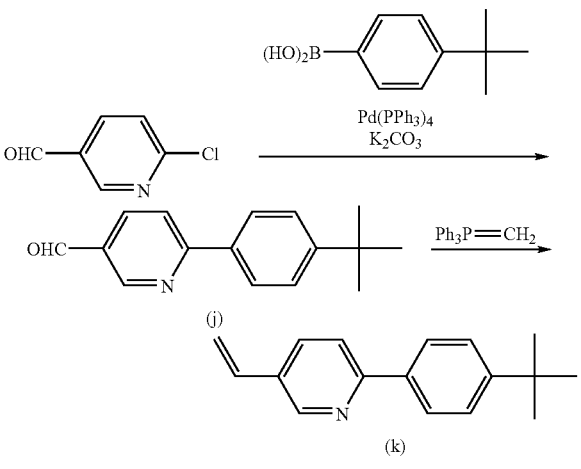

(j)

(k)

5.0 g (35 mmol) of 2-chloro-5-formylpyridine, 6.5 g (37 mmol) of 4-t-butylphenylboronic acid, 0.50 g (0.43 mmol) of tetrakis(triphenylphosphine)palladium and 50 ml of 1,2-dimethoxyethane were mixed together. To the mixture, 50 ml of an aqueous solution of 14.0 g (101 mmol) of potassium carbonate was added, and the mixture was stirred with heating for 5 hours. The organic phase was extracted with ethyl acetate. The solvent was evaporated from the extract under reduced pressure. The residue was purified by silica gel column chromatography (eluting solvent: chloroform/ethyl acetate=4/1), and 4.5 g (19 mmol) of a compound (j) was obtained (54% yield).

5.3 g (15 mmol) of methyltriphenylphosphonium bromide and 25 ml of tetrahydrofuran were mixed together, and the mixture was cooled with ice. To the mixture, 1.7 g (15 mmol) of potassium-t-butoxide was added, followed by stirring for 1 hour. To the mixture, a solution of 3.1 g (13 mmol) of the compound (j) in tetrahydrofuran (20 ml) was added dropwise, and the resultant mixture was stirred at room temperature for 3 hours. The solvent was evaporated from the reaction liquid under reduced pressure. The residue was purified by silica gel column chromatography (eluting solvent: chloroform), and 2.6 g (11 mmol) of a compound (k) was obtained (84% yield).

6.0 g (38 mmol) of a compound (l) (synthesized according to a method described in Tetrahedron Letters, Vol. 46, pp. 8369-8372, 2005), 6.5 g (18 mmol) of iridium chloride trihydrate, 60 ml of 2-ethoxyethanol and 20 ml of water were mixed and heated under reflux for 12 hours. The resultant reaction liquid was combined with a small amount of water, and the precipitated product was filtered off, washed with methanol and dried under reduced pressure to afford 7.5 g (6.9 mmol) of an iridium complex (m) (77% yield).

Thereafter, 3.0 g (2.8 mmol) of the iridium complex (m), 1.5 g (6.3 mmol) of the compound (k), 1.5 g (5.8 mmol) of silver trifluoromethanesulfonate and 100 ml of toluene were mixed and heated under reflux for 3 hours. The resultant reaction liquid was filtered through Celite, and the solvent was evaporated under reduced pressure. The residue was purified by silica gel column chromatography (eluting solvent: toluene). As a result, 0.45 g (0.61 mmol) of an iridium complex (4) was obtained (11% yield).

The identification data of the iridium complex (4) are as follows.

$^1$H-NMR (CDCl$_3$): 7.8-6.8 (18H), 6.47 (1H), 6.50, 5.48 (1H), 5.15 (1H), 3.57 (6H), 1.09 (9H)

Elemental analysis:
theoretical values (C$_{37}$H$_{36}$IrN$_5$): C, 59.82; H, 4.88; N, 9.43.

measured values: C, 60.05; H, 4.79; N, 9.22.

Mass spectroscopy (ESI): 743 (M$^+$)

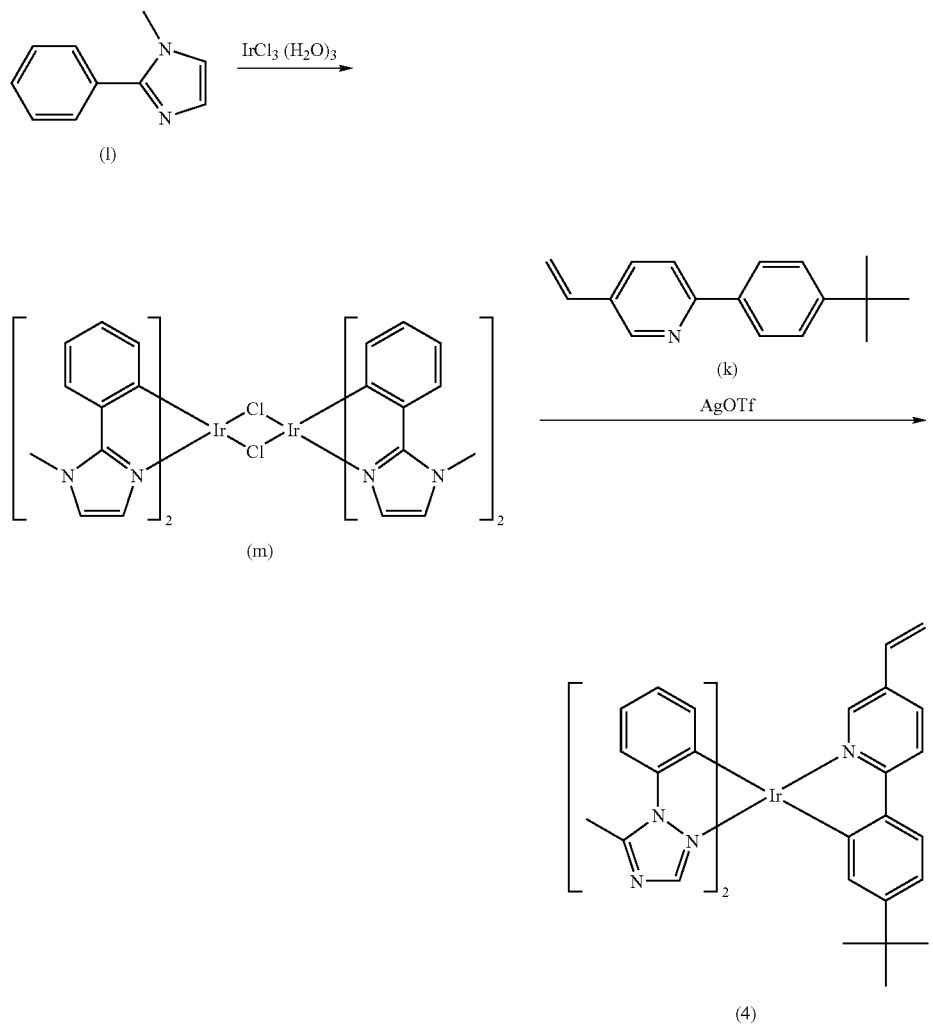

Synthetic Example 5

Synthesis of Iridium Complex (R1)

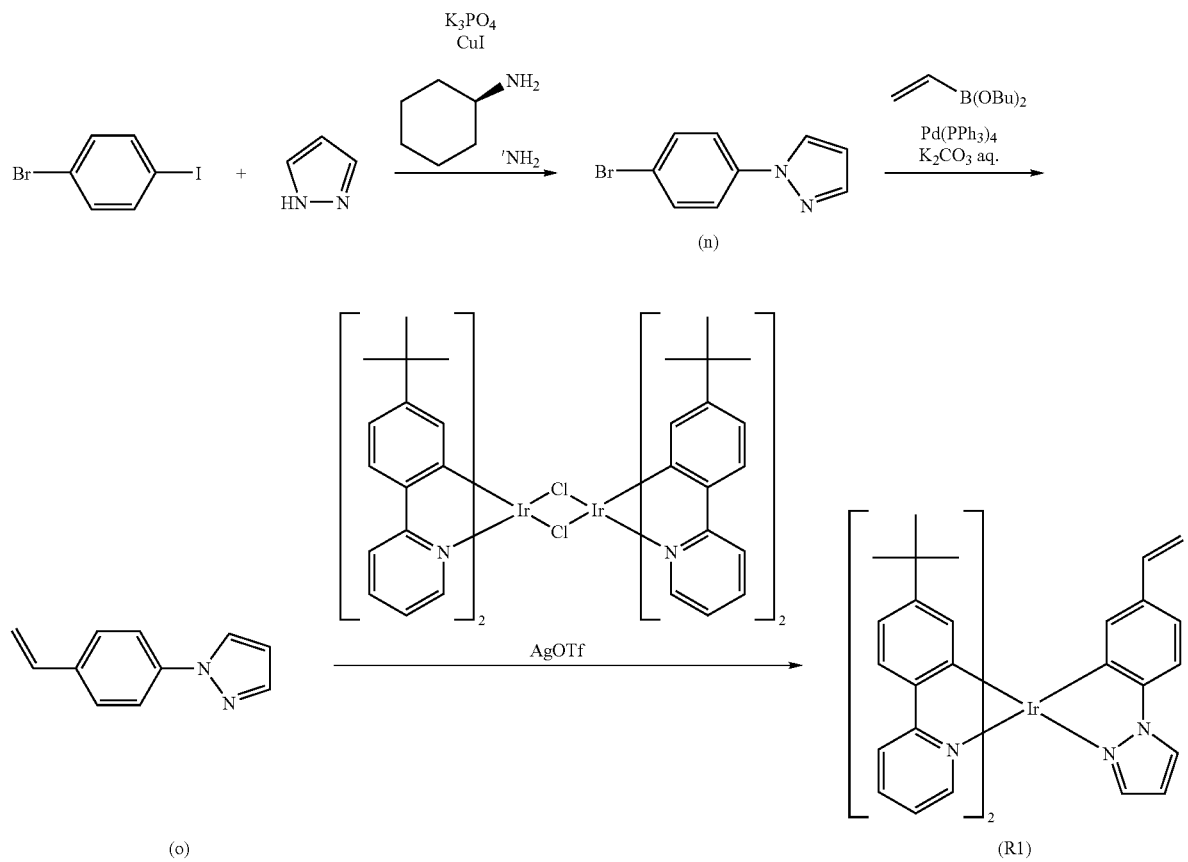

(n)

(o)

(R1)

10 g (35 mmol) of 4-bromoiodobenzene, 2.4 g (35 mmol) of pyrazole, 15 g (71 mmol) of tripotassium phosphate, 90 mg (0.47 mmol) of copper (I) iodide, 250 mg (2.2 mmol) of trans-1,2-cyclohexanediamine and 50 ml of dioxane were stirred together at 110° C. for 24 hours. The resultant reaction liquid was filtered through a glass filter, and the solvent was evaporated under reduced pressure. The residue was purified by silica gel column chromatography (eluting solvent: chloroform), and 3.2 g (14 mmol) of a compound (n) was obtained (41% yield).

Subsequently, 3.0 g (13 mmol) of the compound (n), 2.5 g (14 mmol) of vinylboronic acid dibutyl ester, 0.50 g (0.43 mmol) of tetrakis(triphenylphosphine)palladium and 30 ml of 1,2-dimethoxyethane were mixed together. To the mixture, 25 ml of an aqueous solution of 5.4 g (39 mmol) of potassium carbonate was added, and the mixture was stirred with heating for 5 hours. The organic phase was extracted with ethyl acetate. The solvent was evaporated from the extract under reduced pressure. The residue was purified by silica gel column chromatography (eluting solvent: chloroform), and 1.9 g (11 mmol) of a compound (o) was obtained (86% yield).

Thereafter, 1.0 g (5.9 mmol) of the compound (o), 3.5 g (2.7 mmol) of an iridium complex (p) (synthesized according to a method disclosed in JP-A-2006-8996), 1.6 g (6.2 mmol) of silver trifluoromethanesulfonate and 50 ml of toluene were mixed and heated under reflux for 3 hours. The resultant reaction liquid was filtered through Celite, and the solvent was evaporated under reduced pressure. The residue was purified by silica gel column chromatography (eluting solvent: toluene). As a result, 0.56 g (0.72 mmol) of an iridium complex (R1) was obtained (13% yield).

The identification data of the iridium complex (R1) are as follows.

$^1$H-NMR (CDCl$_3$): 8.0-6.8 (18H), 6.56 (1H), 6.22 (2H), 5.73 (1H), 5.04 (1H), 1.11 (9H), 0.98 (9H)

Elemental analysis:
theoretical values (C$_{41}$H$_{41}$IrN$_4$): C, 62.97; H, 5.28; N, 7.16.
measured values: C, 63.10; H, 5.17; N, 7.01.
Mass spectroscopy (ESI): 782 (M$^+$)

Synthetic Example 6

Synthesis of Iridium Complexes (R2) to (R4)

2-(4-vinylphenyl)pyridine, the compound (d) and the compound (i) were each reacted with the dinuclear iridium complex in the same manner as the synthesis of the iridium complex (R1), resulting in iridium complexes (R2), (R3) and (R4), respectively.

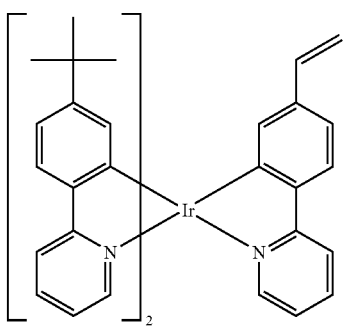

(R2)

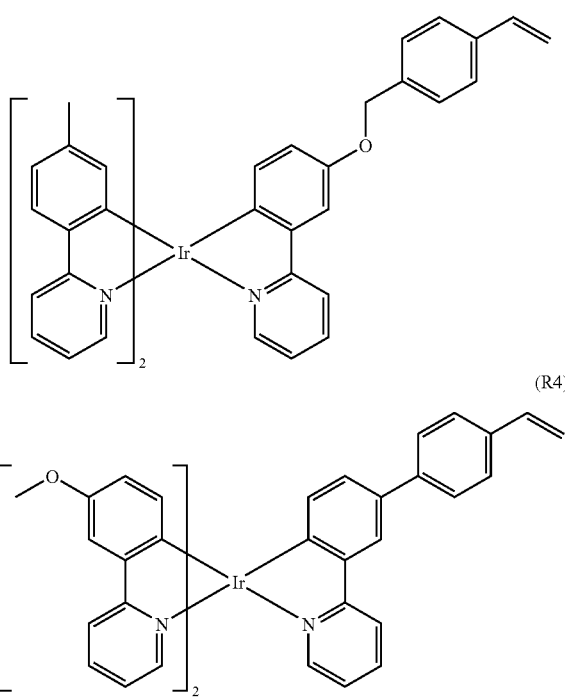

(R3)

(R4)

The identification data of the iridium complex (R2) are as follows.

$^1$H-NMR (CDCl$_3$): 7.9-6.8 (21H), 6.58 (1H), 5.54 (1H), 4.96 (1H), 1.09 (18H)

Elemental analysis:

theoretical values (C$_{43}$H$_{42}$IrN$_3$): C, 65.12; H, 5.34; N, 5.30.

measured values: C, 65.44; H, 5.30; N, 5.16.

Mass spectroscopy (ESI): 793 (M$^+$)

The identification data of the iridium complex (R3) are as follows.

$^1$H-NMR (CDCl$_3$): 8.0-6.8 (25H), 6.75 (1H), 5.65 (1H), 5.19 (1H), 4.21 (2H), 2.30 (3H), 2.17 (3H)

Elemental analysis:

theoretical values (C$_{44}$H$_{36}$IrN$_3$O): C, 64.84; H, 4.45; N: 5.16.

measured values: C, 65.02; H, 4.26; N, 5.09.

Mass spectroscopy (ESI): 815 (M$^+$)

The identification data of the iridium complex (R4) are as follows.

$^1$H-NMR (CDCl$_3$): 8.0-6.8 (25H), 6.76 (1H), 5.75 (1H), 5.23 (1H), 3.66 (6H)

Elemental analysis:

theoretical values (C$_{43}$H$_{34}$IrN$_3$O$_2$): C, 63.22; H, 4.19; N, 5.14.

measured values: C, 63.56; H, 5.27; N, 4.98.

Mass spectroscopy (ESI): 817 (M$^+$)

Example 1

Synthesis of Polymer Compound (1a)

An airtight container was charged with 80 mg of the iridium complex (1), 460 mg of the polymerizable compound of Formula (E1) and 460 mg of the polymerizable compound of Formula (E7). Dehydrated toluene (5.0 ml) was added to the container. Subsequently, a toluene solution (0.1 M, 0.10 ml) of 2,2'-azobis(isobutyronitrile) was added, and resulting mixture was degassed by conducting five freeze-pump-thaw procedures. The evacuated container was tightly closed. The materials were stirred at 60° C. for 60 hours. After the reaction, the reaction liquid was added dropwise to 200 ml of acetone, and a precipitate resulted. The product was purified by being reprecipitated twice in toluene and acetone, and was dried at 50° C. in vacuo overnight to afford a polymer compound (1a). The polymer compound (1a) had a weight-average molecular weight (Mw) of 53600 and a molecular weight distribution (Mw/Mn) of 3.12. From the ICP elemental analysis and $^{13}$C-NMR analysis, the ratio m/(m+n) in the polymer compound (1a) was estimated to be 0.051. In the polymer compound (1a), the ratios x/n and y/n were 0.45 and 0.55, respectively.

Examples 2 to 4 and Comparative Examples 1 to 4

Synthesis of Polymer Compounds (2a) to (4a) and Comparative Polymer Compounds (1b) to (4b)

Polymer compounds (2a) to (4a) and comparative polymer compounds (1b) to (4b) were produced in the same manner as in Example 1, except for the use of the iridium complexes and the polymerizable compounds shown in Table 1.

TABLE 1

| | Polymer compound | Composition of polymer compound | | | Mw | Mw/Mn | m/(m + n) | x/n | y/n |
|---|---|---|---|---|---|---|---|---|---|
| Ex. 1 | 1a | Iridium complex | (1) | 80 mg | 53600 | 3.12 | 0.051 | 0.45 | 0.55 |
| | | Polymerizable compound | (E1) | 460 mg | | | | | |
| | | Polymerizable compound | (E7) | 460 mg | | | | | |
| Ex. 2 | 2a | Iridium complex | (2) | 80 mg | 54200 | 2.83 | 0.082 | 0.46 | 0.54 |
| | | Polymerizable compound | (E6) | 460 mg | | | | | |
| | | Polymerizable compound | (E14) | 460 mg | | | | | |
| Ex. 3 | 3a | Iridium complex | (3) | 80 mg | 42500 | 2.28 | 0.091 | 0.44 | 0.56 |
| | | Polymerizable compound | (E6) | 460 mg | | | | | |
| | | Polymerizable compound | (E14) | 460 mg | | | | | |

TABLE 1-continued

| | Polymer compound | Composition of polymer compound | | | Mw | Mw/Mn | m/(m + n) | x/n | y/n |
|---|---|---|---|---|---|---|---|---|---|
| Ex. 4 | 4a | Iridium complex | (4) | 80 mg | 40600 | 3.27 | 0.085 | 0.44 | 0.56 |
| | | Polymerizable compound | (E6) | 460 mg | | | | | |
| | | Polymerizable compound | (E14) | 460 mg | | | | | |
| Comp. Ex. 1 | 1b | Iridium complex | (R1) | 80 mg | 42400 | 2.78 | 0.049 | 0.43 | 0.57 |
| | | Polymerizable compound | (E1) | 460 mg | | | | | |
| | | Polymerizable compound | (E7) | 460 mg | | | | | |
| Comp. Ex. 2 | 2b | Iridium complex | (R2) | 80 mg | 44100 | 2.53 | 0.060 | 0.45 | 0.55 |
| | | Polymerizable compound | (E1) | 460 mg | | | | | |
| | | Polymerizable compound | (E7) | 460 mg | | | | | |
| Comp. Ex. 3 | 3b | Iridium complex | (R3) | 80 mg | 39000 | 2.21 | 0.088 | 0.48 | 0.52 |
| | | Polymerizable compound | (E6) | 460 mg | | | | | |
| | | Polymerizable compound | (E14) | 460 mg | | | | | |
| Comp. Ex. 4 | 4b | Iridium complex | (R4) | 80 mg | 57600 | 2.73 | 0.085 | 0.46 | 0.54 |
| | | Polymerizable compound | (E6) | 460 mg | | | | | |
| | | Polymerizable compound | (E14) | 460 mg | | | | | |

Manufacturing and Evaluation of Organic EL Devices

Example 5

An ITO glass substrate (product of NIPPO ELECTRIC CO., LTD.) was used. The glass substrate was a 25 mm square, and two stripe electrodes (anodes) of ITO (indium tin oxide) were formed with a width of 4 mm on one surface of the substrate.

The ITO glass substrate was spin coated with poly(3,4-ethylenedioxythiophene)polystyrenesulfonic acid (product name: Baytron P manufactured by Bayer AG) at 3500 rpm for 40 seconds. The coated substrate was dried in a vacuum dryer at reduced pressure and 60° C. for 2 hours, resulting in an anode buffer layer having a thickness of about 50 nm. Subsequently, 90 mg of the polymer compound (1a) was dissolved in 2910 mg of toluene (special grade, manufactured by Wako Pure Chemical Industries, Ltd.). The solution was filtered through a 0.2 μm filter and the filtrate was obtained as a coating solution. The coating solution was spread over the anode buffer layer by spin coating at 3000 rpm for 30 seconds. The coating was dried at room temperature (25° C.) for 30 minutes to form an emitting layer, which was approximately 100 nm in thickness.

The substrate with the emitting layer was placed in a deposition apparatus. Barium and aluminum were codeposited in a weight ratio of 1:10 such that two stripe cathodes were formed with a width of 3 mm and in a direction perpendicular to the anode-extending direction. The cathodes were approximately 50 nm thick.

Thereafter, leads (wires) were attached to the anode and cathode in an argon atmosphere. Thus, four organic EL devices 4 mm in length and 3 mm in width were manufactured. The organic EL devices were energized using a programmable direct voltage/current source (TR6143 manufactured by ADVANTEST CORPORATION) to emit light.

Table 2 sets forth the maximum external quantum efficiency, maximum brightness and luminance half life from 100 cd/m² initial brightness at a constant current.

Example 6

Organic EL devices were manufactured and tested in the same manner as in Example 5, except that the coating solution for the emitting layer was prepared from 90 mg of the polymer compound (2a) and 2910 mg of toluene. Table 2 sets forth the maximum external quantum efficiency, maximum brightness and luminance half life from 100 cd/m² initial brightness at a constant current.

Example 7

Organic EL devices were manufactured and tested in the same manner as in Example 5, except that the coating solution for the emitting layer was prepared from 90 mg of the polymer compound (3a) and 2910 mg of toluene. Table 2 sets forth the maximum external quantum efficiency, maximum brightness and luminance half life from 100 cd/m² initial brightness at a constant current.

Example 8

Organic EL devices were manufactured and tested in the same manner as in Example 5, except that the coating solution for the emitting layer was prepared from 90 mg of the polymer compound (4a) and 2910 mg of toluene. Table 2 sets forth the maximum external quantum efficiency, maximum brightness and luminance half life from 100 cd/m² initial brightness at a constant current.

Comparative Example 5

Organic EL devices were manufactured and tested in the same manner as in Example 5, except that the coating solution for the emitting layer was prepared from 90 mg of the polymer compound (1b) and 2910 mg of toluene. Table 2 sets forth the maximum external quantum efficiency, maximum brightness and luminance half life from 100 cd/m² initial brightness at a constant current.

Comparative Example 6

Organic EL devices were manufactured and tested in the same manner as in Example 5, except that the coating solution for the emitting layer was prepared from 90 mg of the polymer compound (2b) and 2910 mg of toluene. Table 2 sets forth the maximum external quantum efficiency, maximum brightness and luminance half life from 100 cd/m² initial brightness at a constant current.

Comparative Example 7

Organic EL devices were manufactured and tested in the same manner as in Example 5, except that the coating solution for the emitting layer was prepared from 90 mg of the polymer compound (3b) and 2910 mg of toluene. Table 2 sets forth the maximum external quantum efficiency, maximum brightness and luminance half life from 100 cd/m² initial brightness at a constant current.

Comparative Example 8

Organic EL devices were manufactured and tested in the same manner as in Example 5, except that the coating solution for the emitting layer was prepared from 90 mg of the polymer compound (4b) and 2910 mg of toluene. Table 2 sets forth the maximum external quantum efficiency, maximum brightness and luminance half life from 100 cd/m² initial brightness at a constant current.

TABLE 2

|  | Maximum external quantum efficiency (%) | Maximum brightness (cd/m²) | Luminance half life (h) |
|---|---|---|---|
| Ex. 5 | 7.5 | 24400 | 6900 |
| Ex. 6 | 7.8 | 25100 | 7700 |
| Ex. 7 | 6.9 | 30600 | 8000 |
| Ex. 8 | 7.7 | 22900 | 7100 |
| Comp. Ex. 5 | 6.9 | 21900 | 2800 |
| Comp. Ex. 6 | 7.5 | 31000 | 4100 |
| Comp. Ex. 7 | 6.8 | 22500 | 3400 |
| Comp. Ex. 8 | 6.8 | 26600 | 3900 |

INDUSTRIAL APPLICABILITY

The organic EL devices of the invention are suited for use in displays, backlights, electrophotographic systems, illuminating light sources, recording light sources, exposing sources, reading light sources, sings, advertising displays, interior accessories and optical communication systems.

The invention claimed is:

1. A phosphorescent polymer compound comprising structural units that are derived from a compound represented by Formula (1):

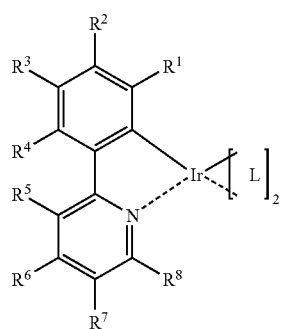

(1)

wherein $R^1$ to $R^8$ are each independently a hydrogen atom, a halogen atom, a cyano group, a C1-10 alkyl group, a C6-10 aryl group, a C1-15 heteroaryl group, an amino group optionally substituted with a C1-10 alkyl group, a C1-10 alkoxy group, a silyl group optionally substituted with a C1-10 alkyl group, or a group having a radically polymerizable functional group, and one of $R^1$ to $R^8$ is a group having a radically polymerizable functional group;

the group having a radically polymerizable functional group has a divalent group which has the longest chain composed of 1 to 5 atoms between the group having a radically polymerizable functional group and the carbon atom on the benzene or pyridine ring coordinated to iridium, the group having a radically polymerizable functional group with the divalent group is at least one selected from the group consisting of those represented by Formulae (a1), (a2) and (a4) to (a7) below

(a1)

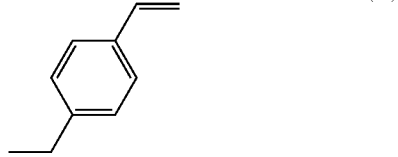

(a2)

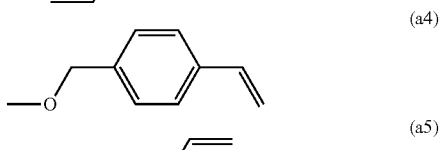

(a4)

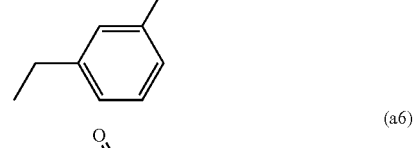

(a5)

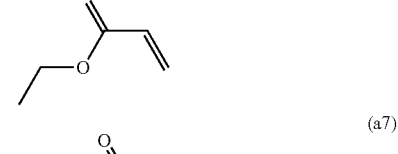

(a6)

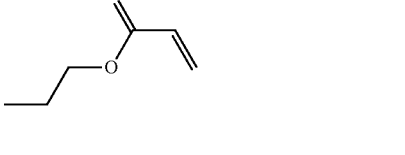

(a7)

L is a ligand represented by any of Formulae (1a) to (1i) below, and the two ligands L may be the same or different from each other; and the five-membered ring in the ligand L may have a substituent group selected from the group consisting of C1-10 alkyl groups, amino groups optionally substituted with a C1-10 alkyl group, and C1-10 alkoxy groups;

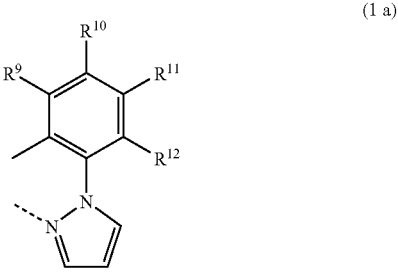

(1a)

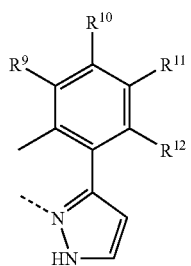
(1 b)

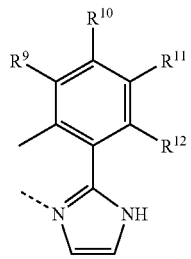
(1 c)

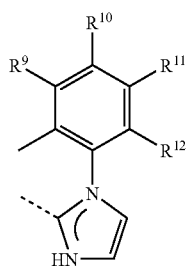
(1 d)

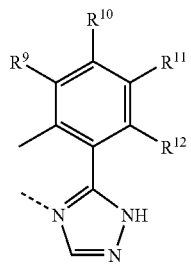
(1 e)

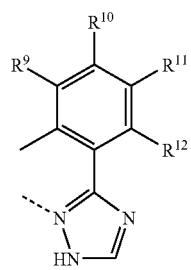
(1 f)

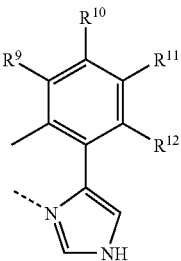
(1 g)

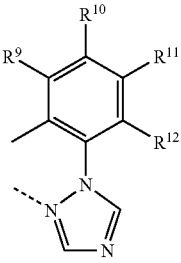
(1 h)

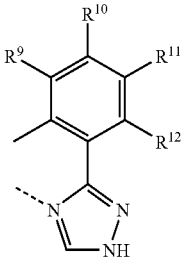
(1 i)

wherein $R^9$ to $R^{12}$ are each independently a hydrogen atom, a halogen atom, a cyano group, a C1-10 alkyl group, an amino group optionally substituted with a C1-10 alkyl group, a C1-10 alkoxy group, or a silyl group optionally substituted with a C1-10 alkyl group.

2. The phosphorescent polymer compound according to claim 1, which further comprises structural units derived from at least one of hole-transporting polymerizable compounds and electron-transporting polymerizable compounds.

3. An organic electroluminescent device comprising a pair of electrodes, and one or more organic compound layers including at least an emitting layer between the electrodes, the emitting layer comprising the polymer compound of claim 1.

4. A process for producing organic electroluminescent devices, comprising a step of forming one or more organic compound layers on an anode, the one or more organic compound layers including at least a layer comprising the polymer compound of claim 1, and a step of forming a cathode on the organic compound layer.

5. A display apparatus including the organic electroluminescent device of claim 3.

* * * * *